US012755801B2

(12) United States Patent
Jiang et al.

(10) Patent No.: US 12,755,801 B2
(45) Date of Patent: Oct. 6, 2026

(54) MEMORY, OPERATION METHOD THEREOF, AND MEMORY SYSTEM

(71) Applicant: YANGTZE MEMORY TECHNOLOGIES CO., LTD., Wuhan (CN)

(72) Inventors: Songmin Jiang, Wuhan (CN); HongTao Liu, Wuhan (CN); Pengyu Xu, Wuhan (CN); Jiameng Cui, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 169 days.

(21) Appl. No.: 18/662,381

(22) Filed: May 13, 2024

(65) Prior Publication Data

US 2025/0166717 A1 May 22, 2025

(30) Foreign Application Priority Data

Nov. 21, 2023 (CN) ......................... 202311567047.1

(51) Int. Cl.

*G11C 16/10* (2006.01)
*G11C 16/04* (2006.01)
*G11C 16/08* (2006.01)
*G11C 16/12* (2006.01)
*G11C 16/34* (2006.01)
*G11C 29/36* (2006.01)

(52) U.S. Cl.

CPC ...... *G11C 16/3459* (2013.01); *G11C 16/0483* (2013.01); *G11C 16/08* (2013.01); *G11C 16/10* (2013.01); *G11C 16/102* (2013.01); *G11C 16/12* (2013.01); *G11C 16/34* (2013.01); *G11C 29/36* (2013.01)

(58) Field of Classification Search

CPC . G11C 16/3459; G11C 16/0483; G11C 16/08; G11C 16/10; G11C 16/102; G11C 16/12; G11C 16/34; G11C 29/36; G11C 11/5628; G11C 16/24

See application file for complete search history.

(56) References Cited

U.S. PATENT DOCUMENTS 8,472,255 B2 * 6/2013 Mokhlesi ............ G11C 11/5628 365/185.24
2006/0152974 A1 * 7/2006 Bathul .................. G11C 16/16 365/185.03

(Continued)

*Primary Examiner* — Amir Zarabian
*Assistant Examiner* — Justin Bryce Heisterkamp
(74) *Attorney, Agent, or Firm* — Conley Rose, P.C.

(57) ABSTRACT

An example of the present disclosure disclose a memory comprising a memory array and a peripheral circuit coupled with the memory array. The memory array comprises a plurality of memory cells. The peripheral circuit is configured to: apply N program voltages to a word line coupled with a to-be-programmed memory cell with a target state being the highest state to perform a first program operation, to program the to-be-programmed memory cell with the target state being the highest state to a first threshold voltage, wherein a difference between a target threshold voltage corresponding to the to-be-programmed memory cell with the target state being the highest state and the first threshold voltage is less than a first preset value, and N is a positive integer; and apply M program voltages to the word line to perform a second program operation.

20 Claims, 11 Drawing Sheets

(56) References Cited

U.S. PATENT DOCUMENTS

| | | | | |
|---|---|---|---|---|
| 2013/0163324 | A1* | 6/2013 | Noh | G11C 16/0483 365/185.02 |
| 2013/0182505 | A1* | 7/2013 | Liu | G11C 16/10 365/185.17 |
| 2016/0203049 | A1* | 7/2016 | Kim | G11C 29/028 |
| 2021/0134359 | A1* | 5/2021 | Park | H10B 41/27 |
| 2022/0157381 | A1* | 5/2022 | Kim | G11C 11/5628 |
| 2022/0392534 | A1* | 12/2022 | Li | G11C 16/0483 |
| 2023/0041949 | A1* | 2/2023 | Chen | G11C 16/102 |
| 2023/0343401 | A1* | 10/2023 | Huang | G11C 16/102 |
| 2024/0145009 | A1* | 5/2024 | Noh | G11C 16/102 |
| 2024/0170068 | A1* | 5/2024 | Mun | G11C 16/3459 |
| 2024/0177786 | A1* | 5/2024 | Park | G11C 16/0483 |

* cited by examiner

SCHEMATIC DIAGRAM OF A RELATIONSHIP BETWEEN AN INITIAL VOLTAGE VALUE AND A MAXIMUM PROGRAM VOLTAGE VALUE

MEMORY, OPERATION METHOD THEREOF, AND MEMORY SYSTEM

CROSS-REFERENCE TO RELATED APPLICATIONS

This application claims priority to and the benefit of Chinese Patent Application 202311567047.1, filed on Nov. 21, 2023, which is hereby incorporated by reference in its entirety.

TECHNICAL FIELD

Examples of the present disclosure relate to semiconductor technology, and relate to, but not limited to, a memory, an operation method thereof, and a memory system.

BACKGROUND

With the rapid development of information technology, memory technology is also witnessing continuous breakthroughs and innovations. A memory is a vital part of a computer system and is responsible for storage and reading of data, which directly affects the performance and user experience of a computer. In the past decades, memories have undergone many important technical breakthroughs and innovations.

SUMMARY

In view of this, examples of the present disclosure provide a memory, an operation method thereof, and a memory system.

In some implementations, examples of the present disclosure provide a memory. The memory comprises a memory array and a peripheral circuit coupled with the memory array. The memory array comprises a plurality of memory cells. The peripheral circuit is configured to: apply N program voltages to a word line coupled with a to-be-programmed memory cell with a target state being the highest state to perform a first program operation, to program the to-be-programmed memory cell with the target state being the highest state to a first threshold voltage, wherein a difference between a target threshold voltage corresponding to the to-be-programmed memory cell with the target state being the highest state and the first threshold voltage is less than a first preset value, and N is a positive integer; and apply M program voltages to the word line to perform a second program operation, to program both the to-be-programmed memory cell with the target state being the highest state and a to-be-programmed memory cell with a target state being another state that are coupled with the word line to respective corresponding target threshold voltages, wherein M is a positive integer.

In some implementations, examples of the present disclosure further provide a memory system, comprising:

- one or more of the memories of any one of the above examples; and
- a memory controller, coupled with the memory, and controlling the memory.

In some implementations, examples of the present disclosure further provide an operation method of a memory, and the method comprises:

- applying N program voltages to a word line coupled with a to-be-programmed memory cell with a target state being the highest state to perform a first program operation, to program the to-be-programmed memory cell with the target state being the highest state to a first threshold voltage, wherein a difference between a target threshold voltage corresponding to the to-be-programmed memory cell with the target state being the highest state and the first threshold voltage is less than a first preset value, and N is a positive integer; and
- applying M program voltages to the word line to perform a second program operation, to program both the to-be-programmed memory cell with the target state being the highest state and a to-be-programmed memory cell with a target state being another state that are coupled with the word line to respective corresponding target threshold voltages, wherein M is a positive integer.

In the examples of the present disclosure, a to-be-programmed memory cell with a target state being the highest state is first programmed to a first threshold voltage, and then to-be-programmed memory cells with target states being the highest state and another state are programmed to target states.

Because the to-be-programmed memory cell with the target state being the highest state has been programmed to the first threshold voltage in a first program operation, a maximum program voltage used to perform a second program operation on the to-be-programmed memory cells with target states being the highest state and another state is less than a maximum program voltage used in a direct program scheme. In addition, in the first program operation, only the memory cell with the target state being the highest state is programmed to the first threshold voltage, and the first threshold voltage is less than a target threshold voltage corresponding to the memory cell with the target state being the highest state. Therefore, a maximum program voltage in the first program operation is also less than the maximum program voltage used in the direct program scheme. That is, the maximum program voltage in the first program operation and the maximum program voltage in the second program operation are both less than the maximum program voltage used in the direct program scheme.

In the examples of the present disclosure, because the maximum program voltages in the program operations are reduced, program disturbance can be effectively mitigated. For a memory cell with a target programmed state being an erased state E0, because program disturbance on the memory cell is reduced, a threshold voltage distribution range corresponding to the memory cell is narrowed down, such that a read window of the memory cell becomes larger.

BRIEF DESCRIPTION OF THE DRAWINGS

In the drawings, like reference numerals may describe like components in different views. Like reference numerals having different letter suffixes may represent different examples of like components. The accompanying drawings illustrate generally, by way of example, but not by way of limitation, various examples as discussed herein.

DETAILED DESCRIPTION

Figure 1A:
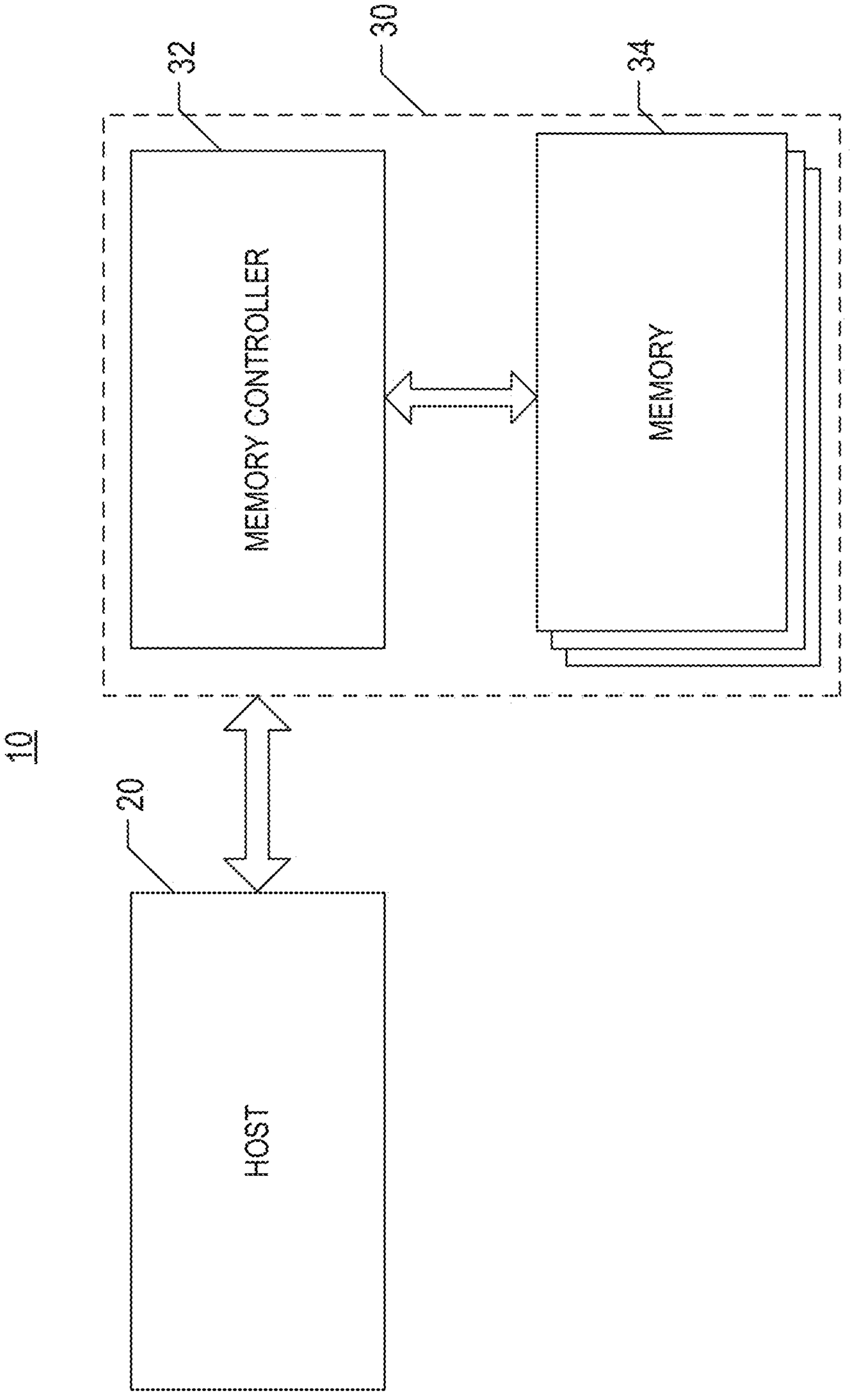
FIG. 1A is a schematic structural diagram of a memory system provided by examples of the present disclosure.

In order to facilitate the understanding of the present disclosure, the present disclosure will be described below more comprehensively with reference to the relevant drawings. Examples of the present disclosure are given in the drawings. However, the present disclosure may be implemented in many different forms, and is not limited to the examples described herein. Instead, the purpose of providing these examples is to make the disclosure of the present disclosure more thorough and comprehensive.

Unless otherwise defined, all technical and scientific terms used herein have the same meanings as those generally understood by those skilled in the art. The terms used in the specification of the present disclosure are only for the purpose of describing specific examples, and are not intended to limit the present disclosure. The term "and/or" used herein comprise any and all combinations of one or more listed associated items.

As shown in FIG. 1A, examples of the present disclosure show an example system 10. The example system 10 may comprise a host 20 and a memory system 30. The example system 10 may comprise, but is not limited to, a mobile phone, a desktop computer, a laptop computer, a tablet computer, a vehicle computer, a gaming console, a printer, a pointing apparatus, a wearable electronic apparatus, a smart sensor, a Virtual Reality (VR) apparatus, an Augmented Reality (AR) apparatus, or any other suitable electronic apparatus having memories 34 therein. The host 20 may be a processor of an electronic apparatus (e.g., a Central Processing Unit (CPU), a System on Chip (SoC), or an Application Processor (AP)).

In an example of the present disclosure, the host 20 may be configured to send or receive data to or from the memory system 30. Here, the memory system 30 may comprise a memory controller 32 and one or more memories 34. The memories 34 may comprise, but are not limited to, a NAND Flash Memory, a vertical NAND Flash Memory, a NOR Flash Memory, a Dynamic Random Access Memory (DRAM), a Ferroelectric Random Access Memory (FRAM), a Magnetoresistive Random Access Memory (MRAM), a Phase Change Random Access Memory (PCRAM), a Resistive Random Access Memory (RRAM), and a Nano Random Access Memory (NRAM), etc.

In an example of the present disclosure, the memory controller 32 may be coupled to the memories 34 and the host 20, and is configured to control the memories 34. In an example, the memory controller 32 may be designed for operating in low duty-cycle environments such as a Secure Digital (SD) card, a Compact Flash (CF) card, a Universal Serial Bus (USB) flash drive, or other media for use in electronic apparatuses, such as a personal computer, a digital camera, and a mobile phone, etc. In some examples, the memory controller 32 may be also designed for operating in a high duty-cycle environment such as SSDs or embedded Multi-Media Cards (eMMCs) used as data storages for mobile apparatuses, such as smartphones, tablet computers, laptop computers, etc., and enterprise memory arrays.

Further, the memory controller 32 can manage data in the memories 34 and communicate with the host. The memory controller 32 may be configured to control read, erase and program operations of the memories 34, may be further configured to manage various functions with respect to data stored or to be stored in the memories 34, comprising, but not limited to, bad-block management, garbage collection, logical-to-physical address conversion, wear leveling, etc., and may be further configured to process Error Checking and Correction (ECC) with respect to the data read from or written to the memories 34. Furthermore, the memory controller 32 may further perform any other suitable functions as well, for example, formatting the memories 34 or communicating with an external apparatus (e.g., the host 20 in FIG. 1A) according to a communication protocol. In an example, the memory controller 32 may communicate with an external host through at least one of various interface protocols, such as a USB protocol, an MMC protocol, a Peripheral Component Interconnect (PCI) protocol, a Peripheral Component Interconnect Express (PCI-E) protocol, an Advanced Technology Attachment (ATA) protocol, a serial ATA protocol, a parallel ATA protocol, a Small Computer System Interface (SCSI) protocol, an Enhanced Small Disk Interface (ESDI) protocol, an Integrated Drive Electronics (IDE) protocol, a Firewire protocol, etc.

Figure 1B:
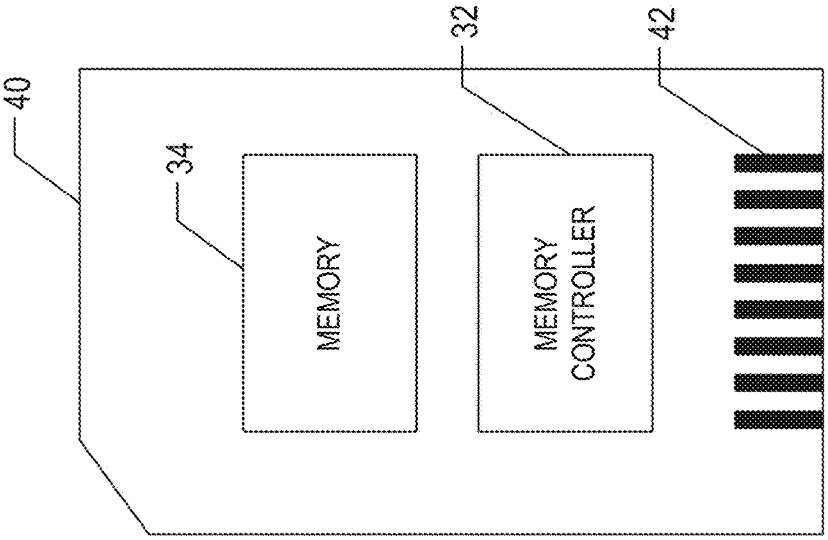
FIG. 1B is a schematic structural diagram of a memory card provided by examples of the present disclosure.
Figure 1C:
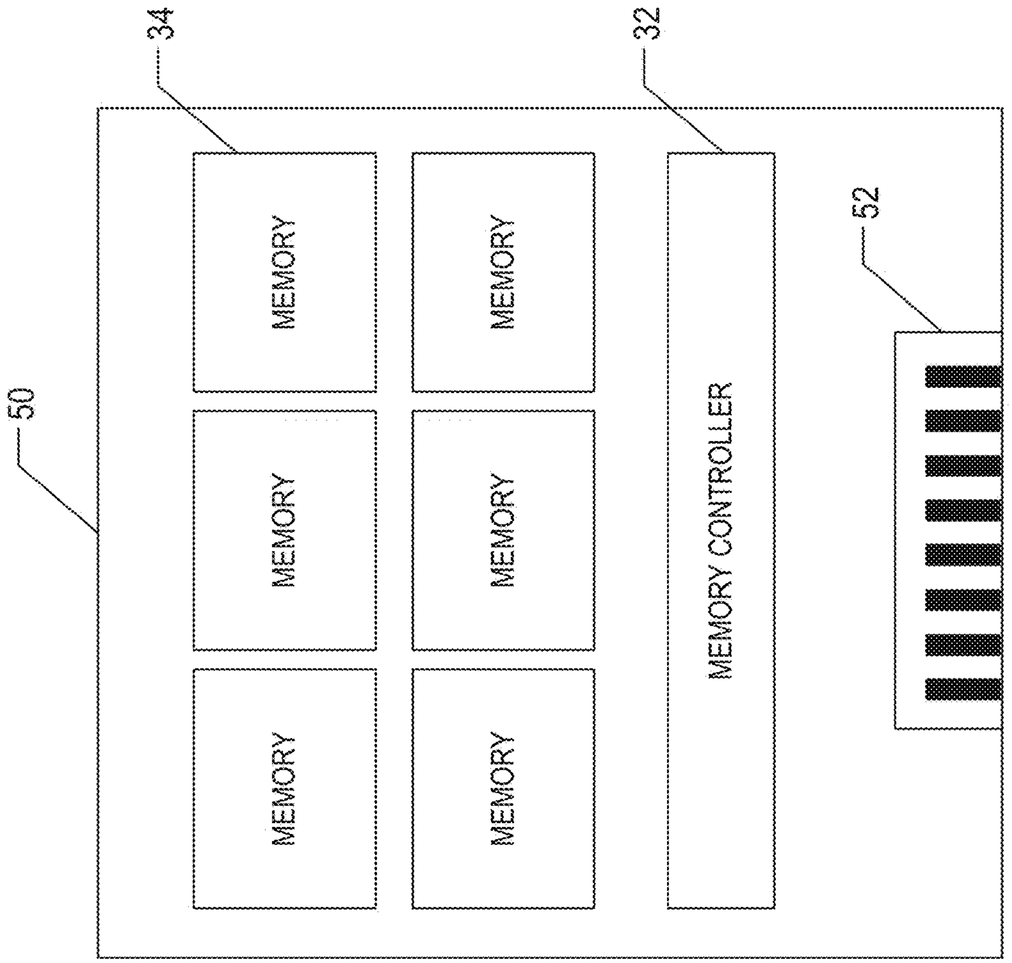
FIG. 1C is a schematic structural diagram of a solid-state disk (SSD) provided by examples of the present disclosure.

In an example of the present disclosure, the memory controller 32 and the one or more memories 34 may be integrated into various types of storage apparatuses, for example, be comprised in the same package, such as a Universal Flash Storage (UFS) package or an eMMC package. That is to say, the memory system 30 may be implemented and packaged into different types of end electronic products. As shown in FIG. 1B, the memory controller 32 and a single memory 34 may be integrated together to form a memory card 40. The memory card 40 may comprise a Personal Computer Memory Card International Association (PC) card, a CF card, a Smart Media (SM) card, a memory stick, a Multi-Media Card (MMC, Reduced-Size MMC (RS-MMC), and MMCmicro), an SD card (SD, miniSD, microSD, Secure Digital High Capacity (SDHC)), and a UFS, etc. The memory card 40 may further comprise a memory card connector 42 coupling the memory card 40 with a host (e.g., the host 20 in FIG. 1A). In another example as shown in FIG. 1C, the memory controller 32 and a plurality of memories 34 may be integrated together to form an SSD 50. The SSD 50 may further comprise an SSD connector 52 coupling the SSD 50 with a host (e.g., the host 20 in FIG. 1A). In some implementations, a storage capacity and/or an operation speed of the SSD 50 are greater than a storage capacity and/or an operation speed of the memory card 40.

Figure 1D:
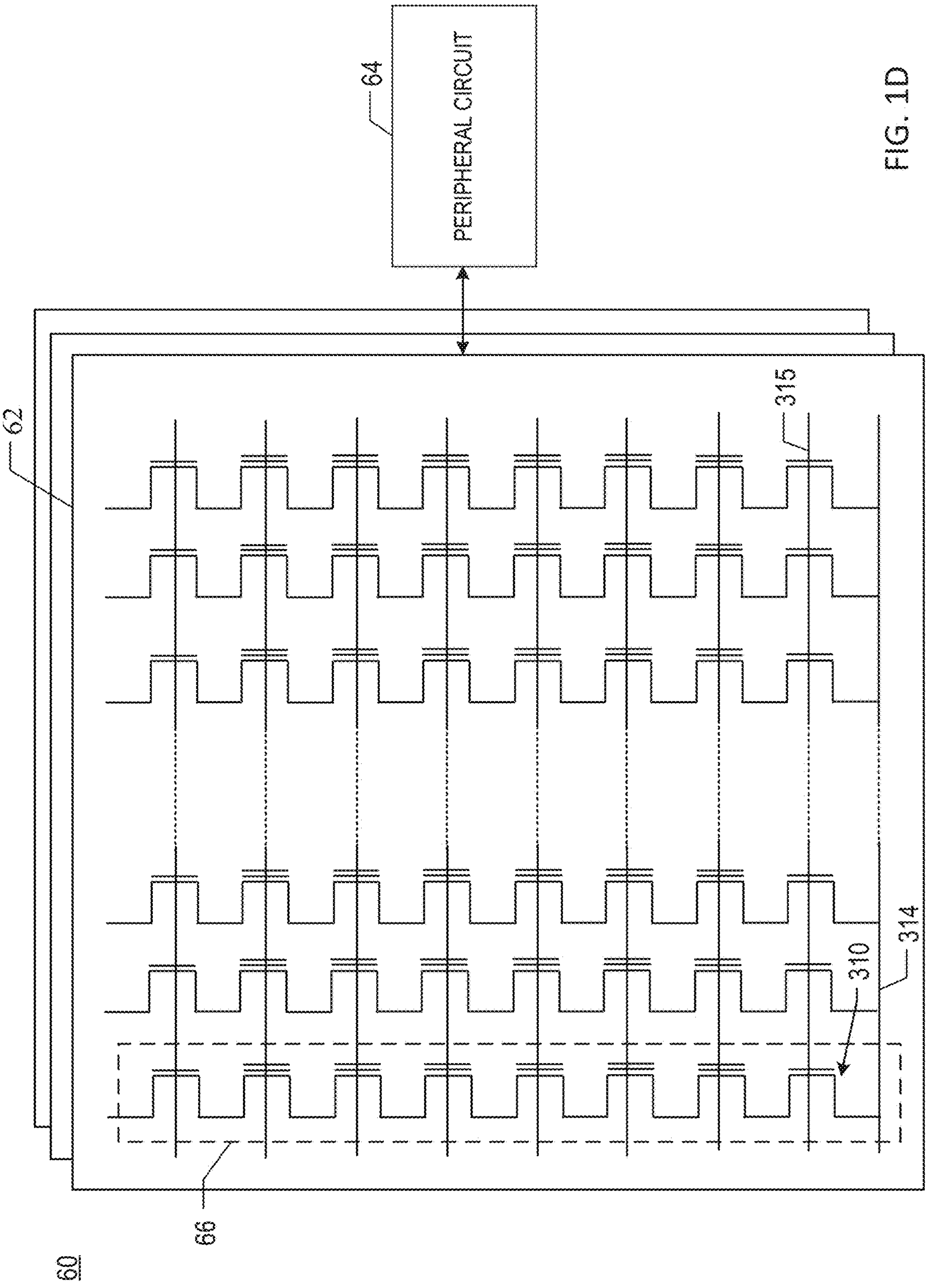
FIGS. 1D and 1E are schematic structural diagrams of a memory comprising a memory array and a peripheral circuit provided by examples of the present disclosure.

It is to be noted that the memory involved in an example of the present disclosure may be a semiconductor memory, which is a solid-state electronic device made by a semiconductor integrated circuit process for storing data information. In an example, FIG. 1D is a schematic diagram of an optional memory 60 in the examples of the present disclosure. The memory 60 may be the memory 34 in FIGS. 1A to 1C. As shown in FIG. 1D, the memory 60 may comprise a memory array 62 and a peripheral circuit 64 coupled to the memory array 62, etc. Here, the memory array may be a NAND flash memory array in which memory cells are disposed in a form of an array of NAND memory strings 66 each extending vertically above a substrate. In some examples, each NAND memory string 66 may comprise a plurality of memory cells that are coupled in series and stacked vertically. Each memory cell may hold a continuous analog value, such as a voltage or charge, which depends on the number of electrons trapped within a region of the memory cell. In addition, each memory cell in the above-mentioned memory array 62 may be either a floating gate type memory cell that comprises a floating gate transistor, or a charge trapping type memory cell that comprises a charge trapping transistor.

In an example of the present disclosure, the memory cell may be a Single Level Cell (SLC) that has two possible storage states, and thus can store one bit of data. For example, the first storage state "0" may correspond to a first threshold voltage range, and the second storage state "1" may correspond to a second threshold voltage range. In some other examples, each memory cell may be a Multi Level Cell (MLC) that is capable of storing more than a single bit of data. For example, the MLC may store two bits per cell. Each memory cell may be a Triple Level Cell (TLC), or each memory cell may be a Quad Level Cell (QLC). Each MLC may be programmed to assume a range of possible nominal storage values. In an example, if each MLC stores two bits of data, the MLC may be programmed to write one of three possible nominal storage values to the memory cell, such that the memory cell is programmed from an erased state to one of three possible programmed states. A fourth nominal storage value may be used for the corresponding erased state.

Figure 1E:
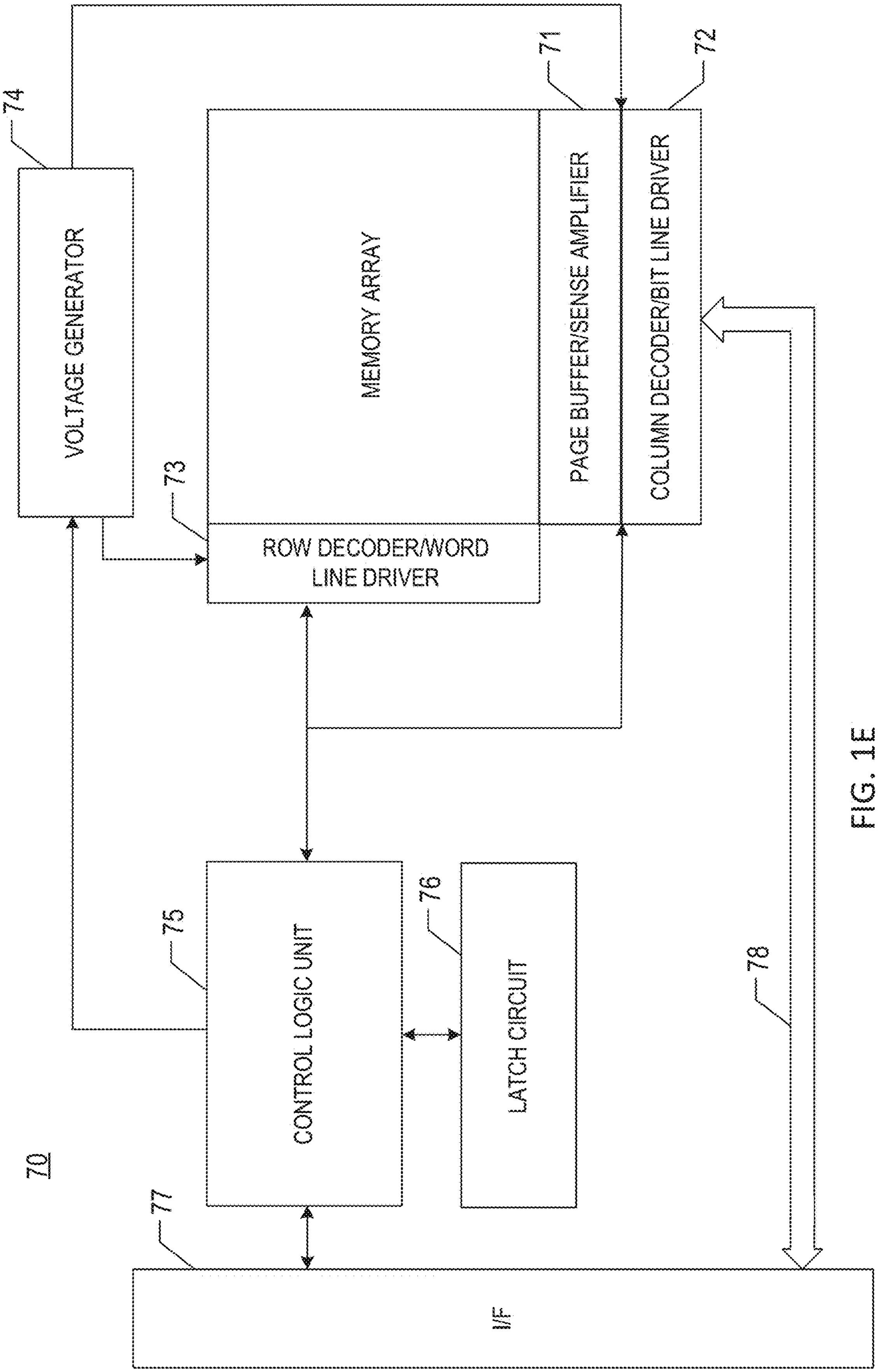

In the examples of the present disclosure, the above-mentioned peripheral circuit may be coupled to the memory array through a Bit Line (BL), a Word Line (WL), a Source Line, a Source Select Gate (SSG) and a Drain Select Gate (DSG). Here, the peripheral circuit may comprise any suitable analog, digital, and hybrid signal circuits for facilitating relevant operations of the memory array by applying and sensing voltage signals and/or current signals to and from each target memory cell via the bit line, the word line, the source line, the SSG, or the DSG, etc. Furthermore, the peripheral circuit may further comprise various types of peripheral circuits formed using a Metal-Oxide-Semiconductor (MOS) technology. In an example, as shown in FIG. 1E, a peripheral circuit 70 may comprise a Page Buffer (PB)/sense amplifier 71, a column decoder/bit line driver 72, a row decoder/word line driver 73, a voltage generator 74, a control logic unit 75, a latch circuit 76, an interface 77, and a data bus 78. It should be understood that the above-mentioned peripheral circuit 70 may be the same as the peripheral circuit 64 in FIG. 1D, and in some other examples, the peripheral circuit 70 may further comprise additional peripheral circuits not shown in FIG. 1E.

In some examples, an increment step pulse program (ISPP) may be used to perform program operations. For a NAND flash memory, the program operation is carried out in a unit of page. A memory cell in one page is taken as an example. After program is started, an initial program voltage is first applied to the memory cell, and then it is verified whether the memory cell is programmed a target threshold voltage. If the target threshold voltage is not reached, a program voltage slightly higher than the initial program voltage is used to continue to program the memory cell. The foregoing process is repeated until it is found in a verify operation that a threshold voltage of the memory cell has reached the target threshold voltage. At this time, the programming of the memory cell is completed. In addition, within a subsequent time, a program prohibition voltage may be applied to the memory cell, such that the memory cell is no longer programmed. When threshold voltages of all of the memory cells on this page are programmed to the target threshold voltage, a program operation of the whole page is finished. Here, this scheme of sequentially programming all to-be-programmed memory cells in one page from a low programmed state to a high programmed state using an increment step pulse program manner is referred to as a direct program scheme. In a program process, if a used maximum program voltage is large, a high pressure resistance of a complementary metal oxide semiconductor (CMOS) is required, and program disturbance becomes severe. The program disturbance refers to that when a program voltage is applied to a word line coupled with a chosen memory cell, an unchosen memory cell coupled (for example, a program prohibition cell) with the word line may be accidentally programmed by mistake. The case that an unchosen memory cell on a chosen word line is programmed by mistake is referred to as "program disturbance".

For a memory cell in an erased state (E0 state), program disturbance on the memory cell is maximum, a threshold voltage distribution range corresponding to the memory cell in the E0 state becomes wider, and as a result a read window of the memory cell becomes smaller.

To resolve the above one or more problems, examples of the present disclosure provide a memory. The memory comprises a memory array and a peripheral circuit coupled with the memory array. The memory array comprises a plurality of memory cells.

The peripheral circuit is configured to: apply N program voltages to a word line coupled with a to-be-programmed memory cell with a target state being the highest state to perform a first program operation, to program the to-be-programmed memory cell with the target state being the highest state to a first threshold voltage, wherein a difference between a target threshold voltage corresponding to the to-be-programmed memory cell with the target state being the highest state and the first threshold voltage is less than a first preset value, and N is a positive integer; and apply M program voltages to the word line to perform a second program operation, to program both the to-be-programmed memory cell with the target state being the highest state and a to-be-programmed memory cell with a target state being another state that are coupled with the word line to respective corresponding target threshold voltages, wherein M is a positive integer.

In the examples of the present disclosure, to-be-programmed memory cells coupled with a same word line (that is, a target word line, a word line for short) are categorized according to target states of the memory cells into the to-be-programmed memory cell with the target state being the highest state and the to-be-programmed memory cell with the target state being another state. An MLC has 4 data states. 1 data state is an erased state, and 3 data states are programmed states. The erased state of the MLC is denoted as E0, and the programmed states of the MLC are a first state to a third state that are sequentially denoted as P1, P2, and P3. The highest state is the P3 state. Other states are the E0 state, the P1 state, and the P2 state. A TLC has 8 data states. 1 data state is an erased state, and 7 data states are programmed states. The erased state of the TLC is denoted as E0, and the programmed states of the TLC are a first state to a seventh state that are sequentially denoted as P1, P2, P3, P4, P5, P6, and P7. The highest state is the P7 state. Other states are the E0 state and the P1 state to the P6 state. A QLC has 16 data states. 1 data state is an erased state, and 15 data states are programmed states. The erased state of the QLC is denoted as E0, and the programmed states of the QLC are a first state to a fifteenth state that are sequentially denoted as P1, P2, P3, P4, P5, P6, P7, P8, P9, P10, P11, P12, P13, P14, and P15. The highest state is the P15 state. Other states are the E0 state and the P1 state to the P14 state. The present disclosure is described below by taking a TLC as an example. It is to be understood that the present disclosure is not limited thereto.

Figure 2A:
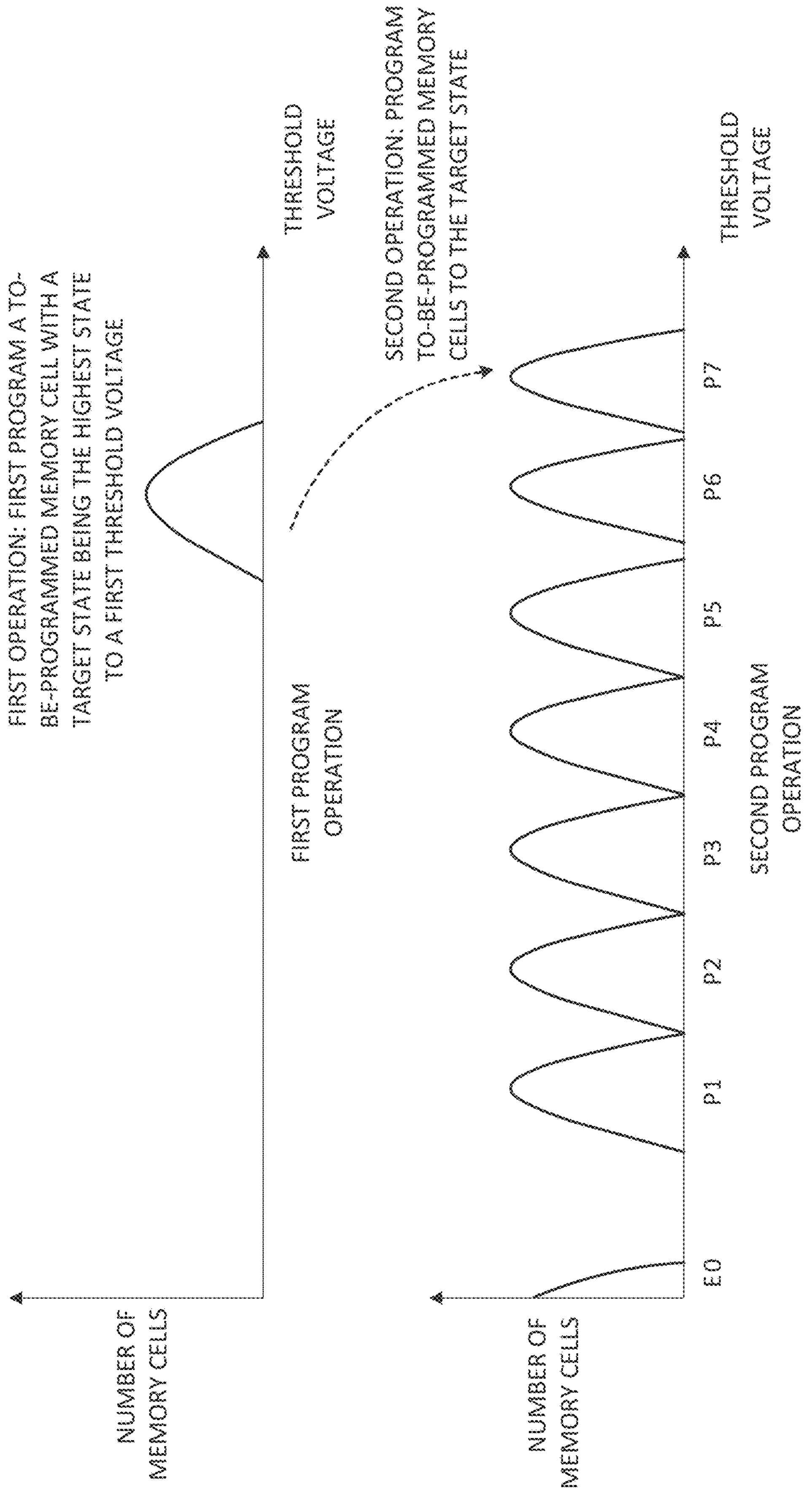
FIG. 2A is a schematic diagram of threshold voltage distributions of memory cells after a first program operation and a second program operation in examples of the present disclosure are used.

In the examples of the present disclosure, as shown in FIG. 2A, a first program operation is first performed on a to-be-programmed memory cell with a target state being the highest state coupled with a target word line, to program the to-be-programmed memory cell with the target state being the highest state to a first threshold voltage. Here, the first threshold voltage may be very close to (but has not reached) a target threshold voltage corresponding to the to-be-programmed memory cell with the target state being the highest state. For example, the first threshold voltage may be greater than or equal to a target threshold voltage corresponding to a to-be-programmed memory cell with a target state being the second highest state (for example, a P6 state). Here, a difference between the target threshold voltage corresponding to the to-be-programmed memory cell with the target state being the highest state and the first threshold voltage may be set to be less than a first preset value (for example, 0 to 0.5 V). By setting the first preset value, it can be ensured that over-programming will not occur during the first program operation. The first preset value may be set according to experience or a simulation result.

In some other examples, the first threshold voltage may have a certain difference from the target threshold voltage corresponding to the to-be-programmed memory cell with the target state being the highest state. For example, the first threshold voltage may be less than the target threshold voltage corresponding to the to-be-programmed memory cell with the target state being the second highest state. A TLC is taken as an example. The first threshold voltage may fall within an interval range corresponding to a target threshold voltage corresponding to a to-be-programmed memory cell with a target state being an intermediate state (for example, between a P3 state and a P5 state).

Figure 3A:
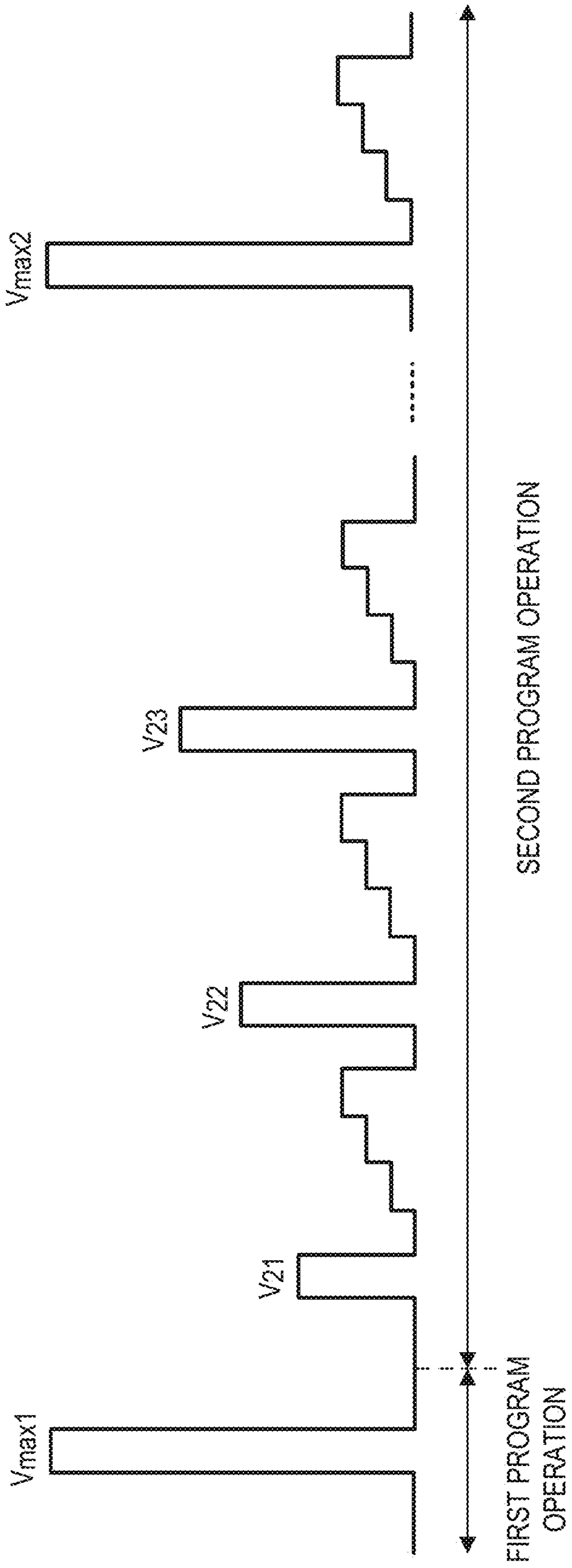
FIGS. 3A and 3B are schematic diagrams of program voltages in a first program operation and a second program operation provided by examples of the present disclosure.
Figure 3B:
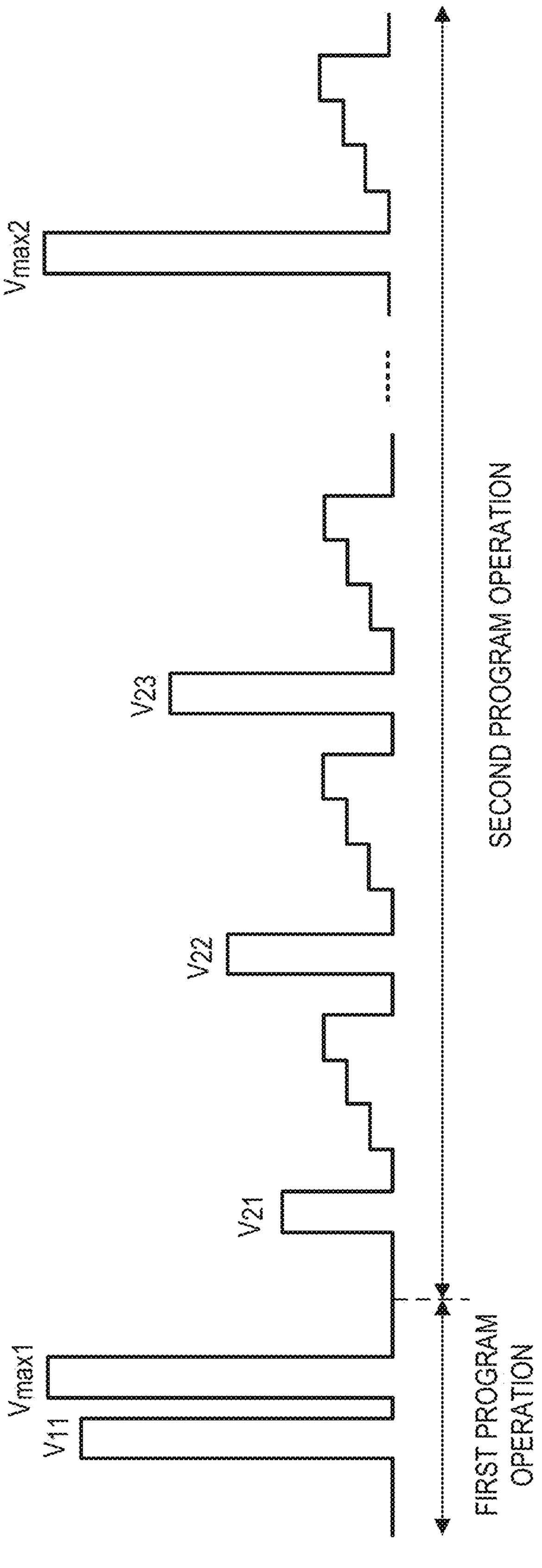

In some examples, with reference to FIGS. 3A and 3B, in the first program operation, N program voltages are applied to a word line coupled with a memory cell with the target state being the highest state. A value of N is less than or equal to 2. That is N=1 or N=2. Here, when a number of N program voltages is smaller, the first program operation takes a shorter time. It may be understood that it takes a certain program time to apply one program voltage each time.

It may be understood that in one aspect, when a number of program voltages comprised in the first program operation is larger, in a phase of the first program operation, on the basis of applying the same highest program voltages, the first threshold voltage that the to-be-programmed memory cell with the target state being the highest state reaches is closer to the target threshold voltage of the to-be-programmed memory cell with the target state being the highest state. In an example, after a program voltage of 20 V is applied to a to-be-programmed memory cell and then a program voltage of 21 V is applied, because electrons are repeatedly injected into the to-be-programmed memory cell with the target state being the highest state, in this case, the threshold voltage corresponding to the to-be-programmed memory cell is greater than a program voltage of 21 V directly applied to the to-be-programmed memory cell. In another aspect, when the number of program voltages comprised in the first program operation is larger, during the first program operation, on the basis of reaching the same first threshold voltage, a magnitude of a required program voltage is smaller. In an example, the threshold voltage reached by directly applying one program voltage of 21 V to the memory cell can be reached by using two program voltages of 20.5 V. In this way, a maximum program voltage used during the first program operation can be reduced by using a plurality of program voltages.

In summary, a program time and an effect after programming are comprehensively considered, and it is appropriate that the value of N is less than or equal to 2.

A second program operation then continues to be performed on the word line, as shown in FIG. 2A, to program both to-be-programmed memory cells with the target state being the highest state and with the target state being another state to respective corresponding target threshold voltages. In the second program operation, M program voltages may be applied to the word line.

It may be understood that because the to-be-programmed memory cell with the target state being the highest state has been programmed to the first threshold voltage in a first program operation, a maximum program voltage used to perform a second program operation on the to-be-programmed memory cells with target states being the highest state and another state is less than a maximum program voltage used in a direct program scheme. In addition, in the first program operation, only the memory cell with the target state being the highest state is programmed to the first threshold voltage, and the first threshold voltage is less than a target threshold voltage corresponding to the memory cell with the target state being the highest state. Therefore, a maximum program voltage in the first program operation is also less than the maximum program voltage used in the direct program scheme. That is, the maximum program voltage in the first program operation and the maximum program voltage in the second program operation are both less than the maximum program voltage used in the direct program scheme.

Figure 2B:
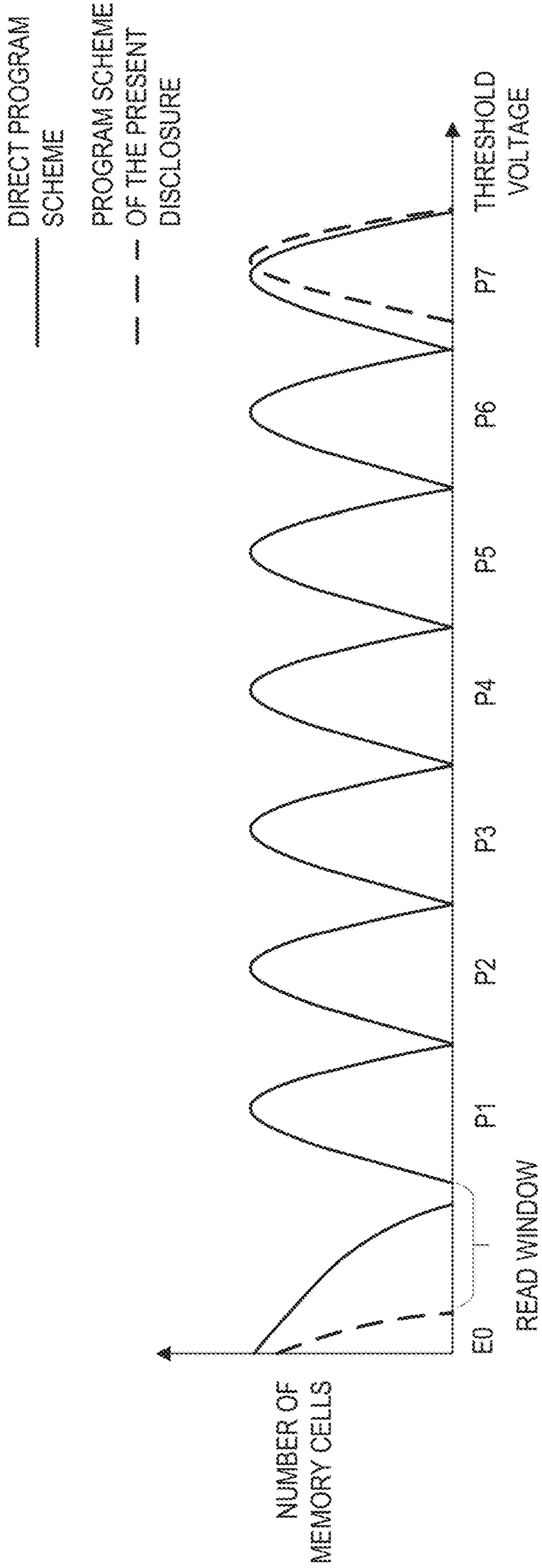
FIG. 2B is a schematic diagram of improvements of threshold voltage distribution curves of an E0 state and a P7 state after a first program operation and a second program operation in examples of the present disclosure are used.

With reference to FIG. 2B, in the examples of the present disclosure, because the maximum program voltages in the program operations are reduced, program disturbance can be effectively mitigated. For a memory cell with a target state being E0, because program disturbance on the memory cell is reduced, as compared with a direct program scheme a threshold voltage distribution range corresponding to the memory cell is narrowed down, such that a read window of the memory cell becomes larger.

After a memory cell is programmed by using a program voltage, a QCL phenomenon occurs within a very short time (on a microsecond level). For the memory cell with the target state being the highest state, the memory cell has already been programmed to a relatively high state during the first program operation, and the QCL phenomenon has fully occurred in the memory cell. In addition, a memory cell with the target state being a P7 state in the present disclosure loses a very small number of electrons in a process of the second program operation. Therefore, during the second program operation, it is only necessary to slightly program the memory cell, and the P7 state can be reached by injecting a small number of electrons. With reference to FIG. 2B, as compared with the direct program scheme, a threshold voltage distribution corresponding to the P7 state in the examples of the present disclosure is narrower.

In some examples, a magnitude of each program voltage of the N program voltages applied during the first program operation is greater than magnitudes of at least some program voltages of the M program voltages applied during the second program operation.

In the examples of the present disclosure, with reference to FIGS. 3A and 3B, $V_{max1}$ in the first program operation and $V_{max2}$ in the second program operation do not have absolute value relationship. That is, the maximum program voltage of the N program voltages applied during the first program operation may be less than, equal to, or greater than the maximum program value of the M program voltages applied during the second program operation. However, a magnitude of each program voltage of the N program voltages applied during the first program operation is greater than magnitudes of at least some program voltages of the M program voltages applied during the second program operation.

The reason is that in the first program operation, the to-be-programmed voltage with the target state being the highest state may be programmed to a higher state as much as possible, and in the second program operation, at least some program voltages are used for programming a memory cell with the target state being a low programmed state. With reference to FIG. 3B, $V_{11}$ and $V_{max1}$ in the first program operation may program the to-be-programmed cell with the target state being the highest state near the P7 state (but still has not reached the P7 state), and $V_{21}$, $V_{22}$, and $V_{23}$ in the second program operation may program to-be-programmed cells with the target state being a P1 state, a P2 state, and the P3 state to respective target states. Therefore, $V_{11}$ and $V_{max1}$ in the first program operation may be both greater than $V_{21}$, $V_{22}$, and $V_{23}$ in the second program operation. Therefore, a magnitude of each program voltage of the N program voltages applied during the first program operation is greater than magnitudes of at least some program voltages of the M program voltages applied during the second program operation.

In some examples, the peripheral circuit is configured to: acquire a value of N, wherein the value of N is determined based on a test result of performing a program test on a test memory.

It may be understood that, in the above example, the value of N is determined by using the test result of performing the program test on the test memory, that is, a number of program voltages that need to be applied to the word line has been determined before the first program operation is performed. In addition, in the test result of performing the program test on the test memory, a value of a program voltage that needs to be applied during the first program operation may further be determined.

In some examples, the value of N may be prestored in a memory. The value of N is affected by a product type, and therefore N may be different in different types of products. Therefore, a program test may be performed on a test memory with a same type as a memory on which a program operation needs to be performed, and the value of N is determined according to the test result. The same types here may be understood as that the structures are same. In an example, the same structures here may be understood as that the structural designs are same.

In some examples, the peripheral circuit is configured to: during the first program operation, each time after a program voltage is applied to the word line, applying a verify voltage to the word line.

In some examples, before the first program operation, the number and magnitudes of program voltages that need to be applied to the word line are unknown. During the first program operation, each time after the program voltage is applied to the word line, a verify voltage continues to be applied to the word line, to prevent the to-be-programmed memory cell with the target state being the highest state from being over-programmed. A number of pulses of the verify voltage is not limited here. Each time after the program voltage is applied, one or more verify voltages may be applied. Each time after the program voltage is applied, when a plurality of verify voltages are applied, for the plurality of verify voltages, a voltage may be increased in a step pulse manner.

In some examples, in a case that the number and magnitudes of program voltages that need to be applied during the first program operation are known, during the first program operation, each time after a program voltage is applied to the word line, a verify voltage may be not applied to the word line, thereby minimizing a program time and improving the overall program efficiency.

In some examples, with reference to FIG. 3B, during the first program operation, the number of program voltages applied to the word line is 2. The 2 program voltages comprise a first program voltage and a second program voltage. The peripheral circuit is configured to: during the first program operation, apply a first program voltage Vu to the word line; and after the first program voltage is applied during the first program operation, apply a second program voltage $V_{max1}$ to the word line. A magnitude of the first program voltage $V_{11}$ is less than a magnitude of the second program voltage $V_{max1}$.

In some other examples, during the first program operation, more than two program voltages may be applied, and magnitudes of these program voltages also gradually increase.

In some examples, to reduce a program time of the first program operation, a pulse width of each program voltage of the N program voltages in the first program operation can be reduced, such that the pulse width of each program voltage of the N program voltages is less than a pulse width of each program voltage of the M program voltages.

In some examples, during the second program operation, the peripheral circuit is configured to: apply an initial program voltage to the word line; and perform the second program operation on the to-be-programmed memory cell with the target state being the highest state and the to-be-programmed memory cell with the target state being another state by gradually adding one step voltage increment on the basis of the initial program voltage.

In some examples, during the second program operation, the initial program voltage may be first applied to the word line. It may be understood that a value of the initial program voltage may be the same as a value of an initial program voltage applied in the direct program scheme. For the to-be-programmed memory cell with the target state being another state, the program voltage applied in the second program operation may be the same as a program voltage applied in the direct program scheme. In addition, the increment step pulse program may be used in the second program operation.

In the second program operation, when a memory cell with the target state being the second highest state has been programmed, for the memory cell with the target state being the highest state, because a threshold voltage of the memory cell is already close to but still does not reach a threshold voltage in the highest state, after the to-be-programmed memory cell with the target state being the second highest state has been programmed, it is only necessary to use a voltage that is slightly lower than the highest program voltage in the direct program scheme to program a memory cell, which is close to but has not reached the highest state and whose target state is the highest state, to the highest state.

The direct program scheme and the program scheme used in the present disclosure are compared and described below with reference to FIG. 4.

Figure 4:
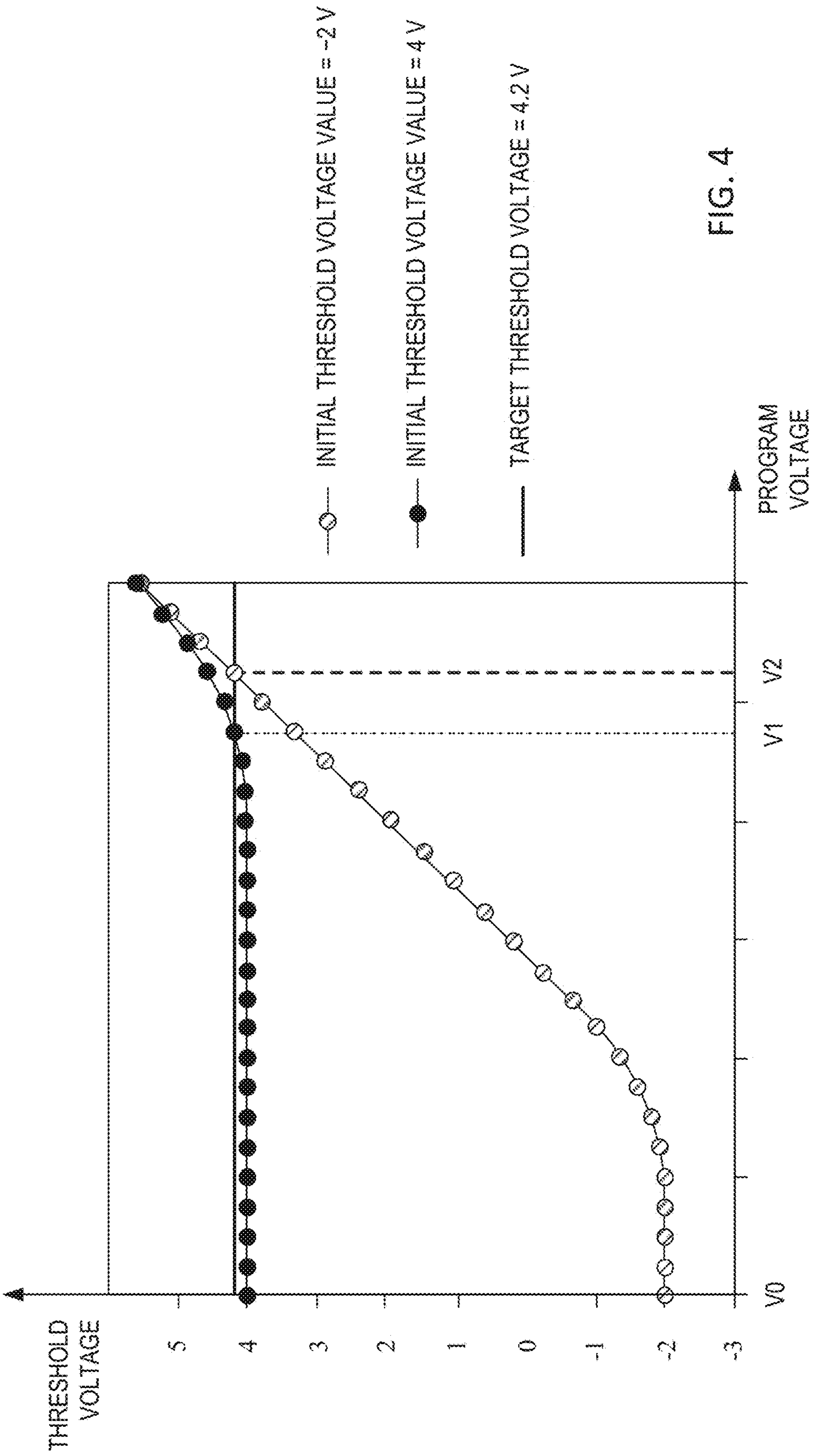
FIG. 4 is a schematic diagram of a relationship between an initial voltage value and a maximum program voltage value.

A curve in which small black dots are located in FIG. 4 represent the program scheme used in the present disclosure, and after the first program operation, at this time, the threshold voltage of the memory cell with the target state being the highest state is 4 V. That is, for the second program operation, its initial threshold voltage value is 4 V. For a to-be-programmed memory cell with the initial threshold voltage value being 4 V, after a maximum program voltage V1 is applied in the second program operation, a target threshold voltage of 4.2 V is reached.

A curve in which small white dots are located in FIG. 4 represents the direct program scheme. In this case, the threshold voltage of the memory cell with the target state being the highest state is −2V. That is, the initial threshold voltage value is −2V. In addition, in the two schemes, the target threshold voltages of the to-be-programmed memory cell with the target state being the highest state are both 4.2 V. For a to-be-programmed memory cell with the initial threshold voltage value being −2V, after a maximum program voltage V2 is applied in the second program operation, a target threshold voltage of 4.2 V is reached. In addition, the maximum program voltage V2 in the direct program scheme is greater than the maximum program voltage V1 in the second program operation in the present disclosure.

Compared with the direct program scheme, by using the program scheme used in the present disclosure, a maximum program voltage in a program process can be reduced, such that program disturbance can be reduced.

In some examples, the peripheral circuit is configured to: during the first program operation, apply a program permission voltage to a bit line coupled with the to-be-programmed memory cell with the target state being the highest state, and apply a program prohibition voltage to a bit line coupled with the to-be-programmed memory cell with the target state being another state.

In the examples of the present disclosure, a program object during the first program operation is only the to-be-programmed memory cell with the target state being the highest state. Therefore, it is necessary to prohibit programming of the to-be-programmed memory cell with the target state being another state. The program prohibition voltage may be applied to the bit line coupled with the to-be-programmed memory cell with the target state being another state to achieve the objective of prohibiting programming of the to-be-programmed memory cell with the target state being another state, and the program permission voltage is applied to the bit line coupled with the to-be-programmed memory cell with the target state being the highest state to achieve the objective of permitting programming of the to-be-programmed memory cell with the target state being the highest state.

In some examples, the peripheral circuit is configured to: during the second program operation, apply a program permission voltage to a bit line coupled with the to-be-programmed memory cell with the target state being the highest state to achieve the objective of permitting programming of the to-be-programmed memory cell with the target state being the highest state.

In some examples, the memory comprises a three-dimensional NAND memory.

The memory provided by the examples of the present disclosure comprises, but is not limited to, a two-dimensional memory (e.g., a two-dimensional NAND memory), and a three-dimensional memory (e.g., a three-dimensional NAND memory). A type of the memory comprises, but is not limited to, a flash memory, a ferroelectric random access memory, a magnetic random access memory, a phase change random access memory and a resistive random access memory.

Examples of the present disclosure further provide a memory system, comprising one or more of the memories 34 and the memory controller 32 coupled with and controlling the memory 34 shown in FIG. 1A.

In some examples, the memory system comprises a memory card or a solid-state disk.

Figure 5:
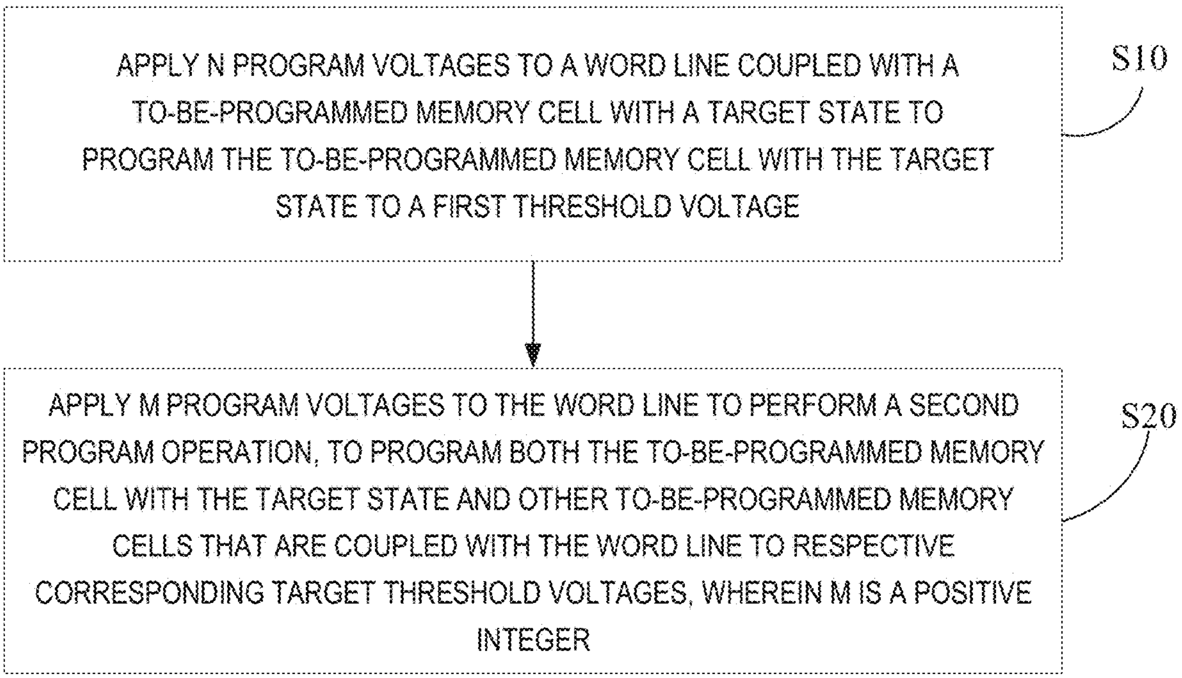
FIGS. 5 and 6 are schematic diagrams of an operation method of a memory provided by examples of the present disclosure.

Examples of the present disclosure further provide an operation method of a memory. With reference to FIG. 5, the method comprises:

Operation S10: Applying N program voltages to a word line coupled with a to-be-programmed memory cell with a target state being the highest state to perform a first program operation, to program the to-be-programmed memory cell with the target state being the highest state to a first threshold voltage, wherein a difference between a target threshold voltage corresponding to the to-be-programmed memory cell with the target state being the highest state and the first threshold voltage is less than a first preset value, and N is a positive integer.

Operation S20: Applying M program voltages to the word line to perform a second program operation, to program both the to-be-programmed memory cell with the target state being the highest state and a to-be-programmed memory cell with a target state being another state that are coupled with the word line to respective corresponding target threshold voltages, wherein M is a positive integer.

In the examples of the present disclosure, a to-be-programmed memory cell with a target state being the highest state coupled with a word line is first programmed to a first threshold voltage, and then to-be-programmed memory cells with target states being the highest state and another state coupled with the word line are programmed to target states.

Because the to-be-programmed memory cell with the target state being the highest state has been programmed to the first threshold voltage in a first program operation, a maximum program voltage used to perform a second program operation on the to-be-programmed memory cells with target states being the highest state and another state is less than a maximum program voltage used in a direct program scheme. In addition, in the first program operation, only the memory cell with the target state being the highest state is programmed to the first threshold voltage, and the first threshold voltage is less than a target threshold voltage corresponding to the memory cell with the target state being the highest state. Therefore, a maximum program voltage in the first program operation is also less than the maximum program voltage used in the direct program scheme. That is, the maximum program voltage in the first program operation and the maximum program voltage in the second program operation are both less than the maximum program voltage used in the direct program scheme.

In the examples of the present disclosure, because the maximum program voltages in the program operations are reduced, program disturbance can be effectively mitigated. For a memory cell with a target programmed state being an erased state E0, because program disturbance on the memory cell is reduced, a threshold voltage distribution range corresponding to the memory cell is narrowed down, such that a read window of the memory cell becomes larger.

After a memory cell is programmed by using a program voltage, a QCL phenomenon occurs within a very short time (on a microsecond level). For the memory cell with the target state being the highest state, the memory cell has already been programmed to a relatively high state during the first program operation, and the QCL phenomenon has fully occurred in the memory cell. In addition, a memory cell with the target state being a P7 state in the present disclosure loses a very small number of electrons in a process of the second program operation. Therefore, during the second program operation, it is only necessary to slightly program the memory cell, and the P7 state can be reached by injecting a small number of electrons. In this way, a threshold voltage distribution corresponding to the P7 state in the examples of the present disclosure is narrow.

In some examples, a magnitude of each program voltage of the N program voltages applied during the first program operation is greater than magnitudes of at least some program voltages of the M program voltages applied during the second program operation.

In some examples, the method further comprises: during the first program operation, each time after a program voltage is applied to the word line, applying a verify voltage to the word line.

Figure 6:
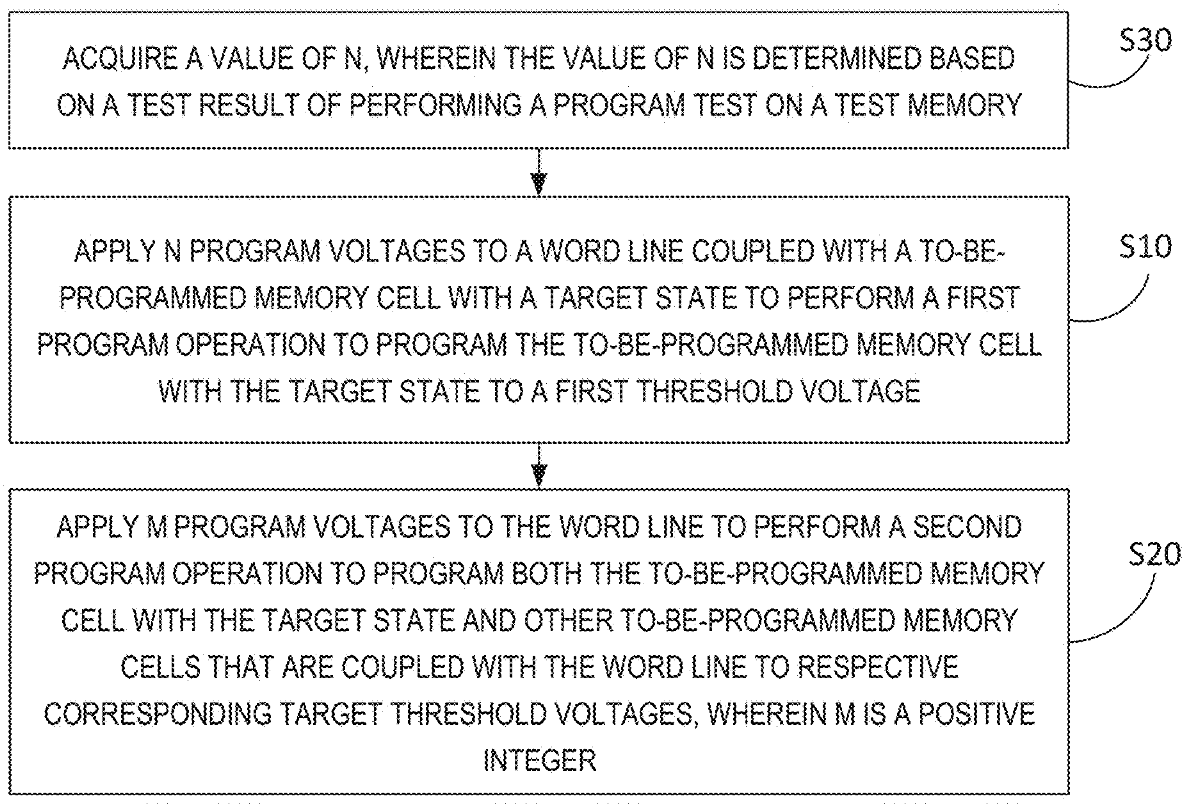

In some examples, with reference to FIG. 6, the method further comprises: Operation S30: Acquire a value of N, wherein the value of N is determined based on a test result of performing a program test on a test memory.

In some examples, the value of N is less than or equal to 2.

In some examples, the applying the N program voltages to the word line comprises: applying a first program voltage to the word line.

After the first program voltage is applied during the first program operation, applying a second program voltage to the word line, wherein a magnitude of the first program voltage is less than a magnitude of the second program voltage.

In some examples, a pulse width of each program voltage of the N program voltages is less than a pulse width of each program voltage of the M program voltages.

In some examples, the applying the M program voltages to the word line coupled with the to-be-programmed memory cell with the target state being the highest state and the to-be-programmed memory cell with the target state being another state comprises: applying an initial program voltage to the word line.

Performing the second program operation on the to-be-programmed memory cell with the target state being the highest state and the to-be-programmed memory cell with the target state being another state by gradually adding one step voltage increment on the basis of the initial program voltage.

In some examples, the method further comprises: during the first program operation, applying a program permission voltage to a bit line coupled with the to-be-programmed memory cell with the target state being the highest state, and applying a program prohibition voltage to a bit line coupled with the to-be-programmed memory cell with the target state being another state.

In some examples, the method further comprises: during the second program operation, applying a program permission voltage to a bit line coupled with the to-be-programmed memory cell with the target state being the highest state.

It is to be understood that, references to "one example" or "an example" throughout this specification mean that example features, structures, or characteristics related to the example are comprised in at least one example of the present disclosure. Therefore, "in one example" or "in an example" presented everywhere throughout this specification does not necessarily refer to the same example. Furthermore, these example features, structures, or characteristics may be incorporated in one or more examples in any suitable manner. It is to be understood that, in various examples of the present disclosure, sequence numbers of the above processes do not indicate an execution sequence, and an execution sequence of various processes shall be determined by functionalities and intrinsic logics thereof, and shall constitute no limitation on an implementation process of the examples of the present disclosure. The above sequence numbers of the examples of the present disclosure are only for description, and do not represent advantages or disadvantages of the examples.

It is to be noted that, the terms "include", "comprise" or any variants thereof herein are intended to cover non-exclusive inclusion, such that a process, a method, an article or a device comprising a series of elements comprise not only those elements, but also other elements not listed explicitly, or elements inherent to this process, method, article or device. An element defined by a statement "comprising one" do not preclude the presence of another identical element in the process, method, article or device comprising this element, without more limitations.

The above descriptions are merely implementations of the present disclosure, and the protection scope of the present disclosure is not limited to these. Any variation or replacement that may be readily figured out by those skilled in the art within the technical scope disclosed by the present disclosure shall fall within the protection scope of the present disclosure. Therefore, the protection scope of the present disclosure shall be defined by the protection scope of the claims.

What is claimed is:

1. A memory, comprising:

a memory array comprising a plurality of memory cells; and a peripheral circuit coupled with the memory array and configured to:

apply N program voltages to a word line coupled with a to-be-programmed memory cell with a target state to perform a first program operation, to program the to-be-programmed memory cell to a first threshold voltage without programming other to-be-programmed memory cells to a first threshold voltage, wherein the target state comprises a highest target state from among multiple target states, wherein a difference between a target threshold voltage corresponding to the to-be-programmed memory cell with the target state and the first threshold voltage is less than a first preset value, and N is a positive integer; and apply M program voltages to the word line to perform a second program operation, to program both the to-be-programmed memory cell with the target state and other to-be-programmed memory cells that are coupled with the word line to respective corresponding target threshold voltages, wherein M is a positive integer.

2. The memory of claim 1, wherein a magnitude of each program voltage of the N program voltages applied during the first program operation is greater than magnitudes of at least some program voltages of the M program voltages applied during the second program operation.

3. The memory of claim 1, wherein the peripheral circuit is configured to:

during the first program operation, each time after a program voltage is applied to the word line, apply a verify voltage to the word line.

4. The memory of claim 1, wherein a value of N is less than or equal to 2.

5. The memory of claim 1, wherein the peripheral circuit is configured to:

during the first program operation, apply a first program voltage to the word line; and after the first program voltage is applied during the first program operation, apply a second program voltage to the word line, wherein a magnitude of the first program voltage is less than a magnitude of the second program voltage.

6. The memory of claim 1, wherein a pulse width of each program voltage of the N program voltages is less than a pulse width of each program voltage of the M program voltages.

7. The memory of claim 1, wherein during the second program operation, the peripheral circuit is configured to:

apply an initial program voltage to the word line; and perform the second program operation on the to-be-programmed memory cell with the target state and the other to-be-programmed memory cells coupled with the word line by gradually adding one step voltage increment based on the initial program voltage.

8. The memory of claim 1, wherein the peripheral circuit is configured to:

during the first program operation, apply a program permission voltage to a bit line coupled with the to-be-programmed memory cell with the target state, and apply a program prohibition voltage to a bit line coupled with the other to-be-programmed memory cells.

9. The memory of claim 1, wherein the peripheral circuit is configured to:

during the second program operation, apply a program permission voltage to a bit line coupled with the to-be-programmed memory cell with the target state.

10. A memory system, comprising:

one or more memory, comprising:

a memory array comprising a plurality of memory cells; and a peripheral circuit coupled with the memory array and configured to:

apply N program voltages to a word line coupled with a to-be-programmed memory cell with a target state to perform a first program operation, to program the to-be-programmed memory cell to a first threshold voltage without programming other to-be-programmed memory cells to a first threshold voltage, wherein the target state comprises a highest target state from among multiple target states, wherein a difference between a target threshold voltage corresponding to the to-be-programmed memory cell with the target state and the first threshold voltage is less than a first preset value, and N is a positive integer; and apply M program voltages to the word line to perform a second program operation, to program both the to-be-programmed memory cell with the target state and other to-be-programmed memory cells that are coupled with the word line to respective corresponding target threshold voltages, wherein M is a positive integer; and a memory controller, coupled with the memory and controlling the memory.

11. An operation method of a memory, comprising:

applying N program voltages to a word line coupled with a to-be-programmed memory cell with a target state to perform a first program operation, to program the to-be-programmed memory cell to a first threshold voltage without programming other to-be-programmed memory cells to a first threshold voltage, wherein the target state comprises a highest target state from among multiple target states, wherein a difference between a target threshold voltage corresponding to the to-be-programmed memory cell with the target state and the first threshold voltage is less than a first preset value, and N is a positive integer; and applying M program voltages to the word line to perform a second program operation, to program both the to-be-programmed memory cell with the target state and other to-be-programmed memory cells that are coupled with the word line to respective corresponding target threshold voltages, wherein M is a positive integer.

12. The operation method of claim 11, wherein a magnitude of each program voltage of the N program voltages applied during the first program operation is greater than magnitudes of at least some program voltages of the M program voltages applied during the second program operation.

13. The operation method of claim 11, further comprising:

during the first program operation, each time after a program voltage is applied to the word line, applying a verify voltage to the word line.

14. The operation method of claim 11, further comprising:

acquiring a value of N, wherein the value of N is determined based on a test result of performing a program test on a test memory.

15. The operation method of claim 11, wherein a value of N is less than or equal to 2.

16. The operation method of claim 11, wherein the applying the N program voltages to the word line comprises:

applying a first program voltage to the word line; and after the first program voltage is applied during the first program operation, applying a second program voltage to the word line, wherein a magnitude of the first program voltage is less than a magnitude of the second program voltage.

17. The operation method of claim 11, wherein a pulse width of each program voltage of the N program voltages is less than a pulse width of each program voltage of the M program voltages.

18. The operation method of claim 11, wherein the applying the M program voltages comprises:

applying an initial program voltage to the word line; and performing the second program operation on the to-be-programmed memory cell with the target state and the other to-be-programmed memory cells coupled with the word line by gradually adding one step voltage increment based on the initial program voltage.

19. The operation method of claim 11, further comprising:

during the first program operation, applying a program permission voltage to a bit line coupled with the to-be-programmed memory cell with the target state, and applying a program prohibition voltage to a bit line coupled with the other to-be-programmed memory cells.

20. The operation method of claim 11, further comprising: during the second program operation, applying a program permission voltage to a bit line coupled with the to-be-programmed memory cell with the target state.

* * * * *